United States Patent [19]

Sakurai

[11] Patent Number: 4,604,642
[45] Date of Patent: Aug. 5, 1986

[54] FE-NI-CU LEADFRAME

[75] Inventor: Toshiharu Sakurai, Yokohama, Japan

[73] Assignee: Kabushiki Kaisha Toshiba, Kanagawa, Japan

[21] Appl. No.: 593,515

[22] Filed: Mar. 26, 1984

[30] Foreign Application Priority Data

Mar. 28, 1983 [JP] Japan .................................. 58-51984

[51] Int. Cl.[4] ...................... H01L 29/54; H01L 23/28; H01L 23/50
[52] U.S. Cl. ......................................... 357/70; 357/67; 357/72; 75/125
[58] Field of Search ................ 357/67, 70, 72; 75/125

[56] References Cited

U.S. PATENT DOCUMENTS

| 1,016,549 | 2/1912 | Clamer ................................... 75/125 |
| 3,600,144 | 8/1971 | Csakvary ............................... 357/67 |
| 4,258,381 | 3/1981 | Inaba ..................................... 357/65 |

FOREIGN PATENT DOCUMENTS

| 52-19072 | 2/1977 | Japan ................................. 357/67 R |
| 58-48927 | 3/1983 | Japan ................................. 357/67 R |

OTHER PUBLICATIONS

Properties and Selection: Stainless Steel Tool Materials and Special Purpose Metals, Metals Handbook, Ninth Edition, vol. 3, Copyright 1980, by the American Society for Metals, pp. 792-793.

S. P. Zarlingo et al., "Leadframe Materials for Packaging Semiconductors", Semiconductor International, Sep., 1982, pp. 111-124.

Primary Examiner—William D. Larkins
Assistant Examiner—John Lamont
Attorney, Agent, or Firm—Banner, Birch, McKie & Beckett

[57] ABSTRACT

What is disclosed is a semiconductor apparatus comprises a semiconductor element, a pair of in-line electrode leads having a mounting island supporting the semiconductor element and a molded housing of resin compound. The electrode leads and mounting island are made of an alloy having a thermal expansion coefficient in the range of about $7 \times 10^{-6}$ 1/C° to about $14 \times 10^{-6}$ 1/C°. Thus, when the device is subjected to temperature variations, there is little warpage or cracking in the device.

4 Claims, 4 Drawing Figures

LEGEND

——— = Fe, Ni
- - - - = Fe, Ni + 4 % by Wt. of Cu

4,604,642

FE-NI-CU LEADFRAME

BACKGROUND OF THE INVENTION

This invention generally relates to the field of semiconductor devices, and more particularly, is directed to a semiconductor device having a novel electrode lead composition.

A semiconductor device 10 typical of those known in the prior art is shown in FIG. 1. The device comprises two rows of in-line electrode leads 11, mounting island 11a, semiconductor chip 13, mounting past 12 and housing 15 molded from a resin compound. Chip 13 is mounted on island 11a with mounting paste 12 with each of its terminals (not shown) connected to respective electrode leads 11 by bonding wire 14. Bonding wire 14 is made of gold or other metals known in the prior art.

In semiconductor devices known in the prior art, such as device 10 shown in FIG. 1, electrode leads 11 and island 11a are made of so-called alloy 42 which consists of 42 wt percent of nickel (Ni) and 58 wt percent of iron (Fe). The thermal expansion coefficient of alloy 42 is very different from that of the resin compound used to mold housing 15, i.e., about $5 \times 10^{-6}$ 1/°C. for alloy 42 as compared to $20 \times 10^{-6}$ 1/°C. for the resin compound. Thus, when semiconductor device 10 is exposed to temperature variations, the dissimilar thermal expansion rates between alloy 42 and the resin compound will cause housing 15 to warp as indicated by upwardly concave portion 17. Cracks 16 may also form at the edges of mounting island 11a. Warping and the occurrence of cracks became more pronounced as the size of chip 13 and island 11a is increased.

Other kinds of metal alloys may also be used to form electrode leads 11 and island 11a. For example, so-called alloy 194 which consist of 97 wt percent of copper and 2.3 wt percent of iron. This alloy has a thermal expansion coefficient of $17 \times 10^{-6}$ 1/°C. which is close to the thermal expansion coefficient for the resin compound used to mold housing 15. The thermal expansion coefficient of alloy 194, however, is very different from that of semiconductor chip 13 which has a thermal expansion coefficient of $3 \times 10^{-6}$ 1/°C. Thus, when device 10 is exposed to temperature variations, the dissimilar thermal expansion rates between alloy 194 and silicon chip 13 will cause mounting island 11a and chip 13 to deform as shown in FIG. 2. When deformation occurs, chip 13 may crack or be peeled away from mounting island 11a.

Other kinds of iron alloys for electrode leads 11 and mounting island 11a have not been used in the prior art because of their lack of resistance to corrosion.

SUMMARY OF THE INVENTION

It is the overall object of the present invention to provide a semiconductor device having an electrode lead composition which does not lead to warping and cracks in the device during temperature variations.

It is a specific object of the present invention to provide a semiconductor device having a high level of quality.

It is a further specific object of the present invention to provide a semiconductor device having good stability during temperature variations.

It is a still further specific object of the present invention to provide a semiconductor device having a long lifetime.

The aforementioned objects are attained in accordance with the present invention by using electrode leads and a mounting island made of an alloy in which the thermal expansion coefficient is within a predetermined range of the thermal expansion coefficient for the resin compound used to mold the device housing and the silicon used to form the semiconductor chip. For resins having a thermal expansion of $20 \times 10^{-6}$ 1/°C. and silicon having a thermal expansion of $3 \times 10^{-6}$ 1/°C., it has been discovered that an alloy having a thermal expansion coefficient which ranges from about $7 \times 10^{-6}$ 1/°C. to about $14 \times 10^{-6}$ 1/°C. is ideal. Thus, during temperature variations, the thermal expansion of the electrode leads and mounting island, the semiconductor chip and the resin compound used to mold the device housing are relatively close together. Therefore, all components expand at about the same rate and are less likely to damage the device.

DETAILED DESCRIPTION OF THE PREFERRED EMBODIMENT

Figure 1:
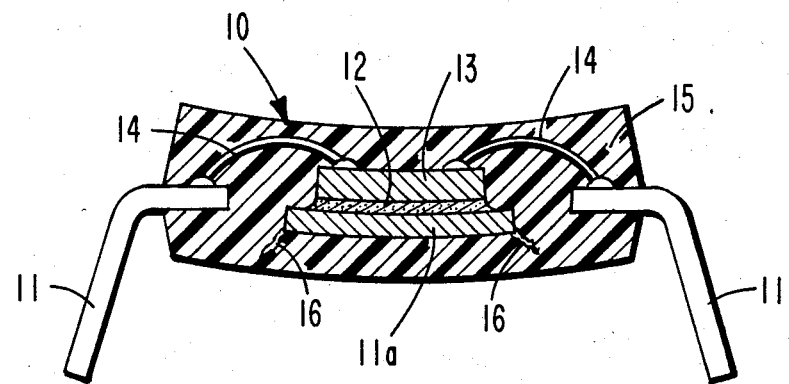
FIG. 1 is a sectional view of a semiconductor device known in the prior art.
Figure 2:
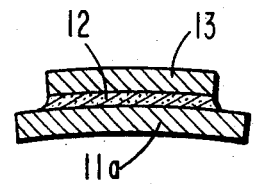
FIG. 2 is a partial sectional view of a semiconductor device also known in the prior art.
Figure 3:
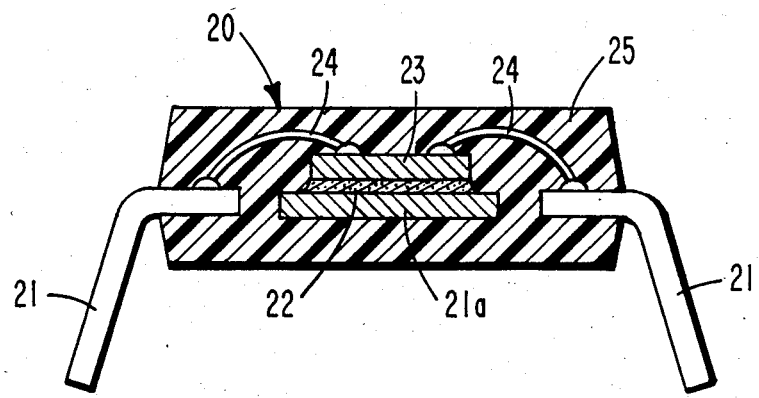
FIG. 3 is a sectional view of a semiconductor device in accordance with the present invention.

Referring now to the drawings, a preferred embodiment of the present invention will be explained. In FIG. 3, a DIP (Dual In-line Pin) type of semiconductor device with 42 pins (lead electrodes) is shown. The device comprises two rows of in-line electrode leads 21 having mounting island 21a and a semiconductor chip 23 mounted on island 21a by silver mounting paste 22. Mounting paste 22 may also comprise an eutectic mixture of gold (Au) and silicon (Si) or may be a solder compound consisting of lead (Pb) and tin (Sn). Semiconductor chip 23 includes the actual integrated circuitry for the device. Each of electrode leads 21 is electrically connected to a respective terminal (not shown) of semiconductor chip 23 by bonding wires 24 made of gold. Device 20 also includes housing 25 made of a mixture of epoxy resin and silica ($SiO_2$).

As explained above, if the thermal expansion coefficient of the electrode leads and mounting island of semiconductor devices is very different from that of the resin compound used to mold the device housing (about $20 \times 10^{-6}$ 1/°C.) and that of the semiconductor chip (about $3 \times 10^{-6}$ 1/°C.), the housing and semiconductor chip may become deformed and crack during temperature variations. Therefore, the present invention utilizes a particular alloy which has a thermal expansion coefficient which is intermediate between the thermal expansion coefficient of the silicon (Si) which forms the semiconductor chip and the thermal expansion coefficient of the resin compound which forms the device housing. Thus, during temperature variations the stresses occurring between the mounting island, the semiconductor chip and the molding resin are more equally dispersed.

Accordingly, there is less likelihood of warpage and cracks forming in the device during temperature variations.

Electrode leads 21 and mounting island 21a in accordance with the present invention are made of an alloy having a thermal expansion coefficient equal to or within $13 \times 10^{-6}$ 1/°C. of the thermal expansion coefficient of the resin used to mold the device housing and equal to or within $11 \times 10^{-6}$ 1/°C. of the thermal expansion coefficient of the material, e.g., silicon, used to form the semiconductor chip. It has been discovered that for a resin having a thermal expansion coefficient of $20 \times 10^{-6}$ 1/°C. and silicon having a thermal expansion coefficient of $3 \times 10^{-6}$ 1/°C., the alloy forming the electrode leads and mounting island should ideally have a thermal expansion coefficient ranging from about $7 \times 10^{-6}$ 1/°C. to about $14 \times 10^{-6}$ 1/°C. This range is achieved with electrode leads consisting of copper (Cu) ranging from 3 wt percent to 8 wt percent, nickel (Ni) ranging from 25 wt percent to 30 wt percent, with the remaining element of the composition consisting of iron (Fe).

With reference to Table 1, three alloys A, B and C are shown. Alloy A consists essentially of 25 wt percent of nickel, 4 wt percent of cooper, and 71 wt percent of iron. Alloy B consists essentially of 30 wt percent of nickel, 4 wt percent of copper, and 66 wt percent of iron. Alloy C consists essentially of 30 wt percent of nickel, 8 wt percent of copper and 62 wt percent of iron. These alloys also contain less than 1 wt percent of additional elements as impurities, for example, manganese (Mn), carbon (C), silicon (Si), phosphorous (P) and sulphur (S). Table 1 also shows the respective thermal expansion coefficients α of alloys A, B and C. For comparison, the thermal expansion coefficients for alloy 42, alloy 194, and silicon and molding resin are also given.

TABLE 1

|  | Ni wt % | Cu wt % | Fe wt % | Other Additives wt % | Thermal Expansion Coefficient α ($\times 10^{-6}$ 1/C.°) |
| --- | --- | --- | --- | --- | --- |
| Silicon |  |  |  |  | 3 |
| Molding Resin |  |  |  |  | 20 |
| Alloy 42 | 42 | — | 58 | >1 | 5 |
| Alloy 194 | — | 97 | 2.3 | >1 | 17 |
| Alloy A | 25 | 4 | 71 | >1 | 14 |
| Alloy B | 30 | 4 | 66 | >1 | 13 |
| Alloy C | 30 | 8 | 62 | >1 | 7 |

Two groups of semiconductor devices were manufactured with electrode leads made for alloys A, B and C as shown in Table 1. One group of devices included a semiconductor chip 6 mm×6 mm in size. The other group included a semiconductor chip 8 mm×8 mm in size. Thirty devices from each group and catagory of alloys A, B and C were then run through 100 cycles of heat and cold. Each cycle comprised the steps of maintaining the devices at a temperature of 25° C. for five minutes; then raising the temperature to 200° C. for 30 minutes, then lowering the temperature to 25° for five minutes; then finally lowering the temperature to −65° C. for 30 minutes. The results of the heat and cold cycles are shown in Table 2.

TABLE 2

|  | Crack in Chip | | Crack in Molding Resin | |
| --- | --- | --- | --- | --- |
|  | 6 mm × 6 mm | 8 mm × 8 mm | 6 mm × 6 mm | 8 mm × 8 mm |
| Alloy 42 | 0/30 | 0/30 | 5/30 | 30/30 |
| Alloy 194 | 4/30 | 18/30 | 0/30 | 0/30 |
| Alloy A | 0/30 | 1/30 | 0/30 | 0/30 |
| Alloy B | 0/30 | 0/30 | 0/30 | 0/30 |
| Alloy C | 0/30 | 0/30 | 0/30 | 5/30 |

As Table 2 shows, the incidence of semiconductor chip cracking and molding resin cracking is significantly lower for devices having electrode leads and mounting islands made from alloys A, B or C in accordance with the present invention than for devices having electrode leads and mounting islands made from alloy 42 and alloy 194 as known in the prior art. Note that none of the devices employing alloy B cracked. Only one of the devices employing alloy A cracked. It should be noted, however, that this failure was in a device having the larger semiconductor chip size. As pointed out above, the incidence of warpage and cracking is higher in devices having a larger semiconductor chip size. The higher failure rate for larger size chips is also noted by the five failures experienced with alloy C. Ordinary integrated circuits employ a semiconductor chip having a size in the range of 2 mm×2 mm to 4 mm×4 mm. Thus, either alloys A, B or C would consistently provide a failure-free device in normal applications.

As can be seen from Table 2, semiconductor devices having electrode leads and mounting islands in accordance with the present invention are far superior to devices having conventional electrode leads and mounting islands. A much higher incident of failure is shown by devices having electrode leads of alloys 42 and 194. Alloys having a thermal expansion coefficient in the range of $7 \times 10^{-6}$ 1/°C. to $14 \times 10^{-6}$ 1/°C., may be used for semiconductor devices having a semiconductor chip 6 mm×6 mm in size. If the thermal expansion coefficient of the alloy is less than $7 \times 10^{-6}$ 1/°C. in semiconductor devices employing a semiconductor chip larger than 8 mm×8 mm, there is a tendency for the resin housing to crack.

Figure 4:
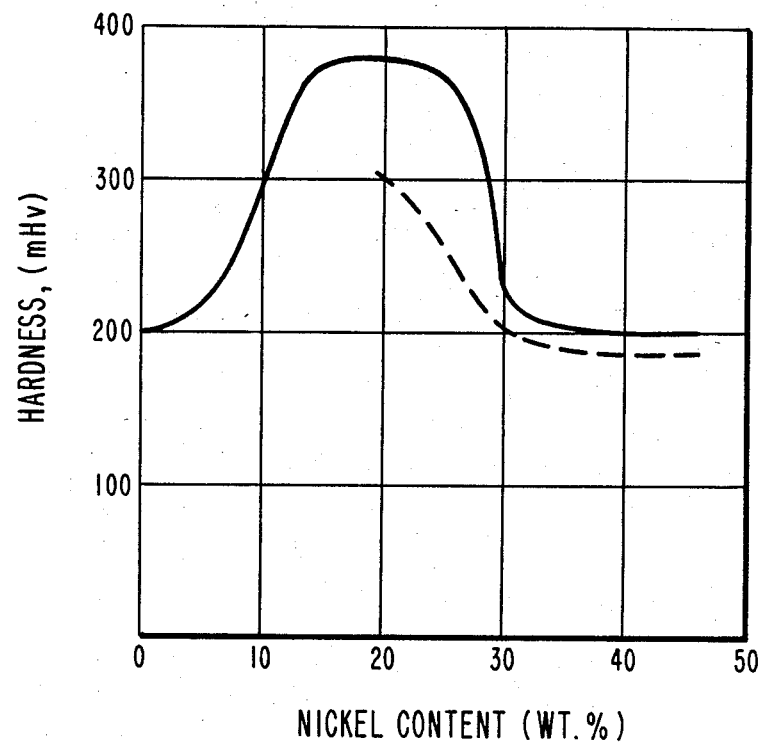
FIG. 4 is a graph showing the hardness characteristics of an alloy used to form the electrode leads and mounting island of a semiconductor device in accordance with the present invention.

FIG. 4 shows a graph of the hardness characteristics of two electrode leads in accordance with the present invention where an additional amount of nickel has been added to the composition of the electrode lead alloy. One of the electrode lead consist essentially of iron and nickel. The other electrode lead consists essentially of iron, nickel and 4 wt percent of copper. As shown in FIG. 4, if the amount of nickel ranges from 10 wt percent to 23 wt percent, the alloy is too hard to permit the electrode to be easily shaped by press forming. Further, it is not desirable for the amount of nickel to be too high because of the high cost of nickel in comparison with the cost of copper and iron. And, if the amount of nickel is less than 10 wt percent, the alloy does not have sufficient corrosion resistant. Therefore, an alloy having a thermal expansion coefficient ranging from $7 \times 10^{-6}$ 1/°C. to b $14 \times 10^{-6}$ 1/°C., is convenient for the electrode leads and mounting island in a device having a housing of resin compound because it is easy to form, has sufficient corrosion resistance and is low in cost.

I claim:

1. In a semiconductor device comprising a semiconductor element:
   a pair of in-line lead electrodes having a mounting island supporting the semiconductor element;
   a molding resin body substantially enclosing said semiconductor element and said electrodes, wherein said electrodes and island are made from an alloy essentially consisting of 3 wt percent to 8 wt percent of copper (Cu), 25 wt percent to 30 wt percent of nickel (Ni) and the remaining amount of iron (Fe), said electrodes having a thermal expansion coefficient in the range of about $7 \times 10^{-6}$ 1/°C. to about $14 \times 10^{-6}$ 1/°C.

2. A semiconductor device according to claim 1 wherein the size of said semiconductor element is larger than 6 mm $\times$ 6 mm.

3. A semiconductor device according to claim 1 wherein said electrodes has a thermal expansion coefficient which is greater than the thermal expansion coefficient of said semiconductor element but is smaller than the thermal expansion coefficient of said molding resin.

4. In a semiconductor device comprising a semiconductor element having a first thermal expansion coefficient:
   a material forming said semiconductor element;
   a pair of in-line lead electrodes having a mounting island supporting said semiconductor element and having a second thermal expansion coefficient, where said lead electrodes essentially consists of 3 wt percent to 8 wt percent of copper (Cu), 25 wt percent to 30 wt percent of nickel (Ni), and the remaining amount of iron (Fe);
   a molding resin body substantially enclosing said semiconductor element and said lead electrodes and having a third thermal expansion coefficient; and
   wherein said second thermal expansion coefficient is within $11 \times 10^{-6}$ 1/°C. of said first thermal expansion coefficient and is within $13 \times 10^{-6}$ 1/°C. of said third thermal expansion coefficient.

* * * * *